United States Patent [19]
Schultz et al.

[11] Patent Number: 5,712,565
[45] Date of Patent: Jan. 27, 1998

[54] MR SENSOR HAVING THICK ACTIVE REGION BETWEEN TWO THINNER INACTIVE MR REGIONS TOPPED WITH RESPECTIVE PERMANENT MAGNETS

[75] Inventors: Allan E. Schultz, St. Paul; Peter K. George, Bloomington; Arthur Calderon, Minnetonka; Jumna P. Ramdular, Brooklyn Park; Juan J. Fernandez-De Castro, Lakeville; Leroy L. Longworth, Waconia, all of Minn.; Peter I. Bonyhard, Scotts Valley, Calif.

[73] Assignee: Seagate Technology, Inc., Scotts Valley, Calif.

[21] Appl. No.: 302,799

[22] PCT Filed: Jun. 22, 1994

[86] PCT No.: PCT/US94/07064

§ 371 Date: Sep. 13, 1994

§ 102(e) Date: Sep. 13, 1994

[87] PCT Pub. No.: WO95/35508

PCT Pub. Date: Dec. 28, 1995

[51] Int. Cl.$^6$ .................................................. G01R 33/02
[52] U.S. Cl. ........................................ 324/252; 360/113
[58] Field of Search ............................. 324/207.21, 252; 360/113; 338/32 R

[56] References Cited

U.S. PATENT DOCUMENTS

| | | | |
|---|---|---|---|
| 4,556,925 | 12/1985 | Suenaga et al. | 360/113 |
| 4,639,806 | 1/1987 | Kira et al. | 360/113 |
| 5,193,039 | 3/1993 | Smith et al. | 360/113 |
| 5,218,497 | 6/1993 | Tanabe et al. | 360/113 |
| 5,260,652 | 11/1993 | Collver et al. | 324/252 |
| 5,268,806 | 12/1993 | Goubau et al. | 360/113 |
| 5,285,339 | 2/1994 | Chen et al. | 360/113 |

FOREIGN PATENT DOCUMENTS

| | | |
|---|---|---|
| 0 582 342 A1 | 2/1994 | European Pat. Off. . |
| 0 585 008 A2 | 3/1994 | European Pat. Off. . |

OTHER PUBLICATIONS

Romankiw, *Mechanically Coupled Barberpole MR Head With Built-In Longitudinal Bias Structure and Process*, IBM Technical Disclosure Bulletin, vol. 20, No. 2, Jul. 1977, pp. 791–793.

Smith et al., *An Improved Thin Film Permanent Magnet Material and Novel Magnet Design for Magnetoresistive Sensor Biasing*, IEEE Transactions on Magnetics, vol. 26, No. 5, Sep. 1990, pp. 2409–2411.

Liao et al., *Stability and Biasing Characteristics of a Premanent Magnet Biased SAL/MR Device*, IEEE Transactions on Magnetics, vol. 30, No. 6, Nov. 1994, pp. 3855–3857.

Liao et al., Abstract of *Stability and Biasing Characteristics of a Permanent Magnet Biased SAL/MR Device*, IEEE Transactions on Magnetics, vol. 30, No. 6, Nov. 1994.

*Primary Examiner*—Sandra L. O'Shea
*Assistant Examiner*—Jay M. Patidar
*Attorney, Agent, or Firm*—Kinney & Lange, P.A.

[57] ABSTRACT

A magnetoresistive sensor (10) having permanent magnet stabilization includes a magnetoresistive layer (12), at least one permanent magnet (14a or 14b), and first and second current contacts (16a and 16b). The magnetoresistive layer (12) has an active sensing region (18) having a first thickness, and at least one under layer region (26a or 26b), with each under layer region (26a or 26b) having a second thickness that is less than the first thickness. Each permanent magnet (14a or 14b) is formed upon an under layer region (26a or 26b) of the magnetoresistive layer (12), and the first and second contacts (16a and 16b) are electrically coupled to the active region (18).

15 Claims, 4 Drawing Sheets

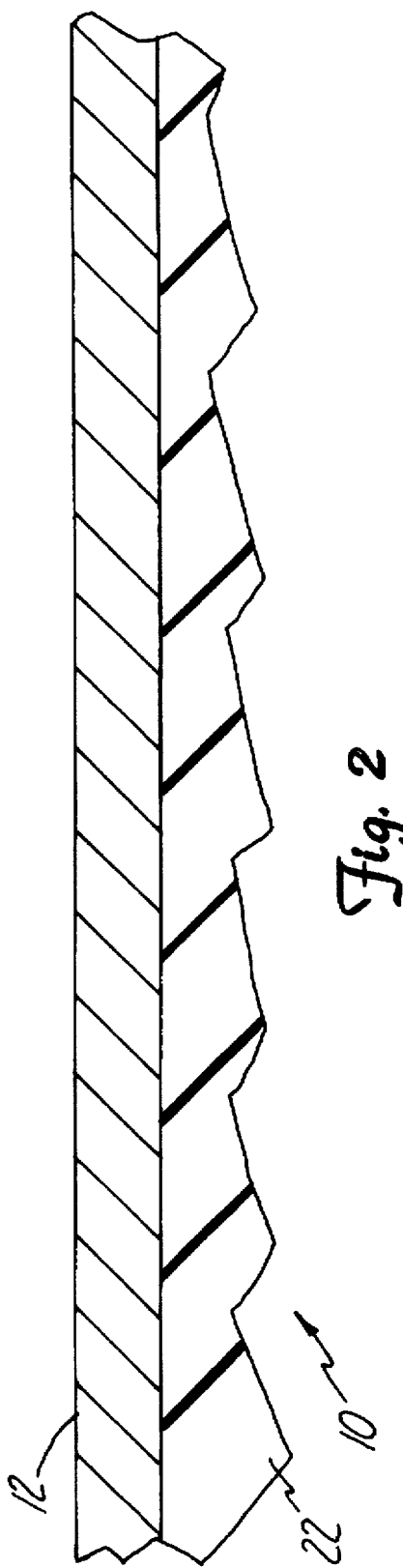
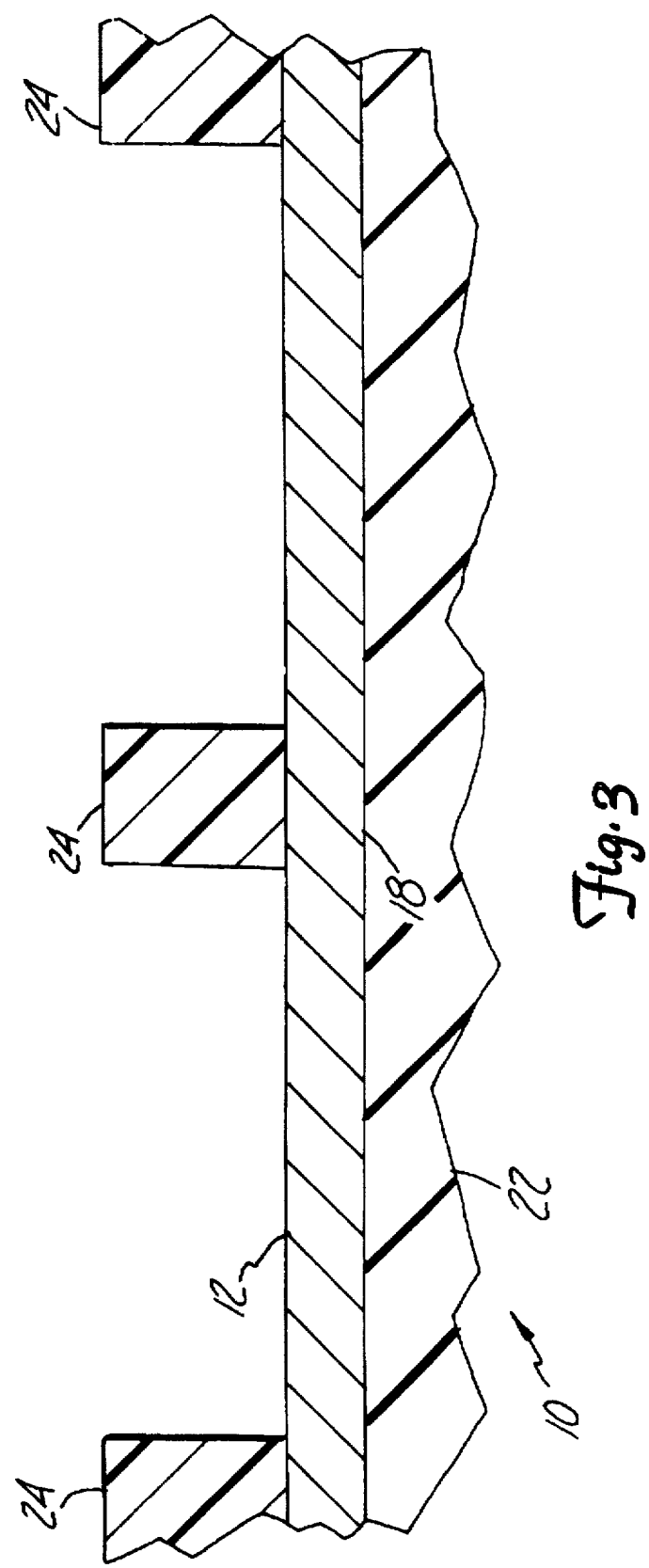

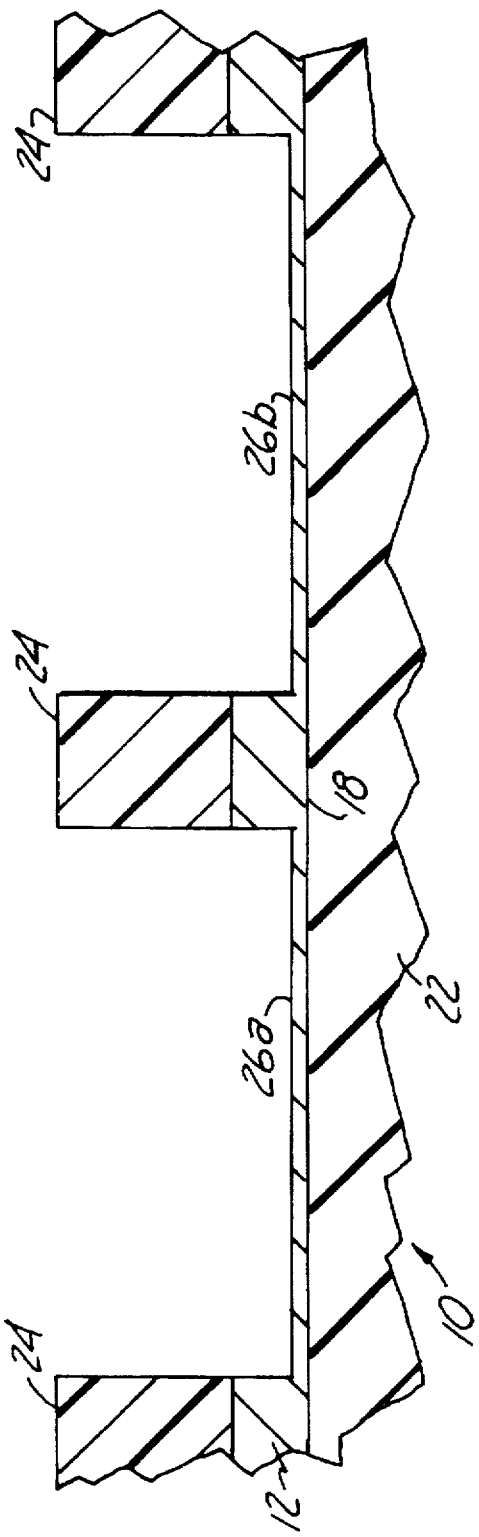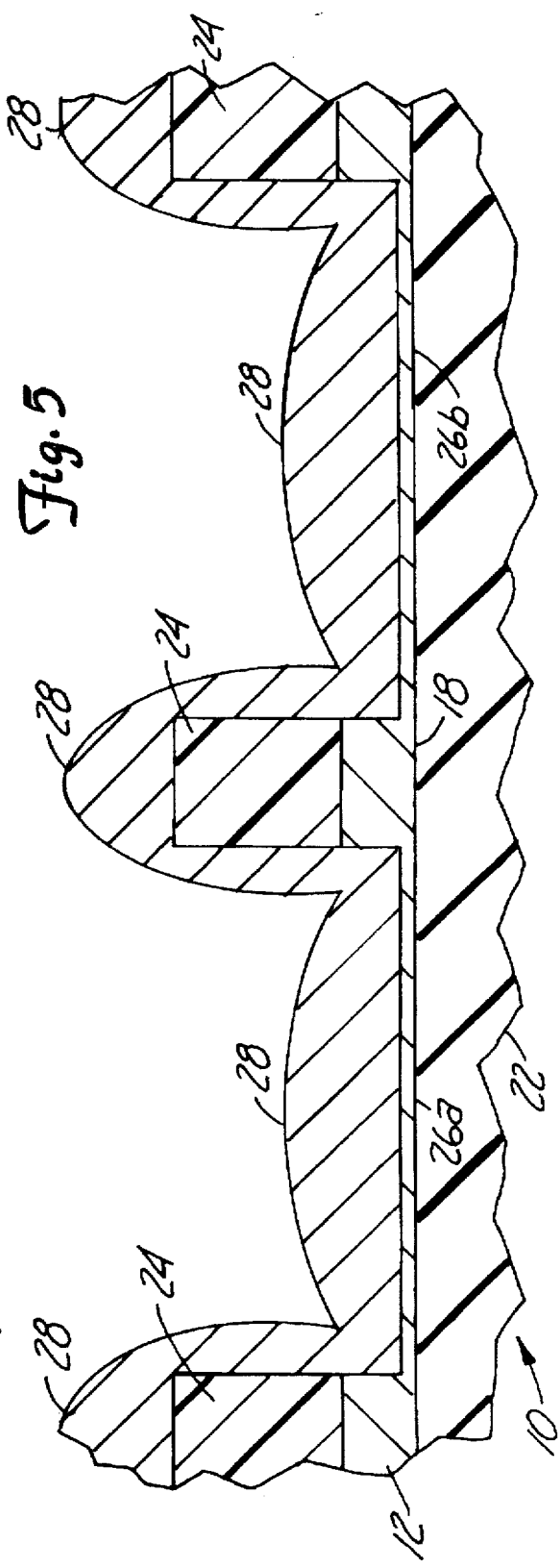

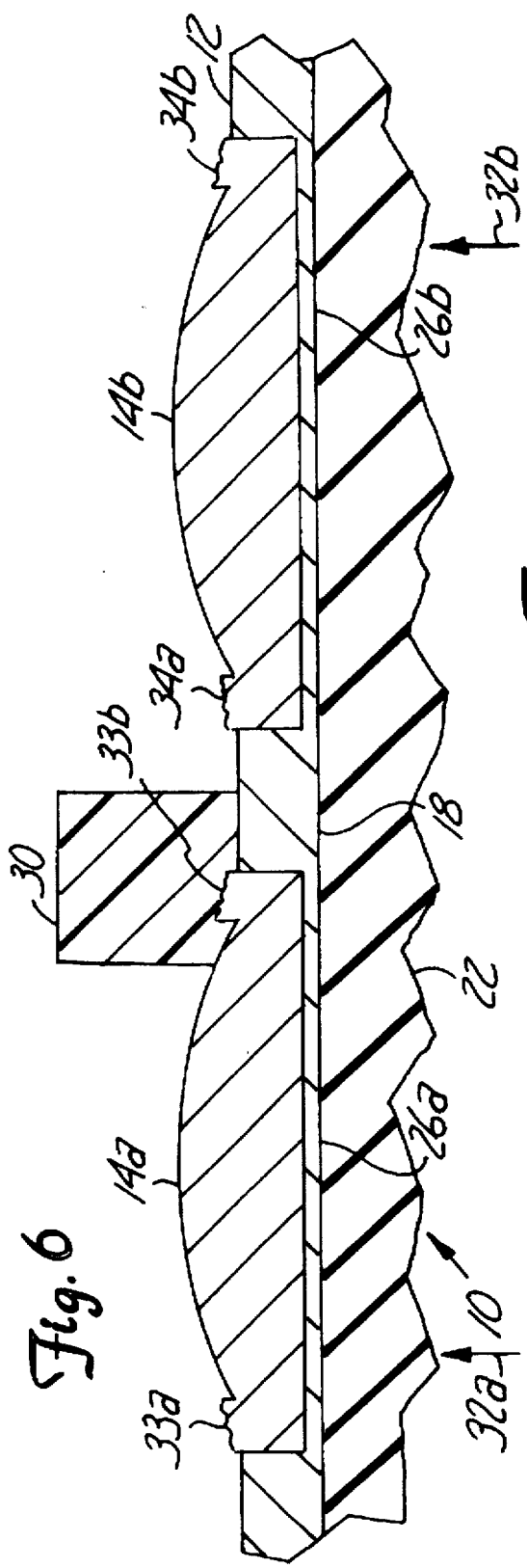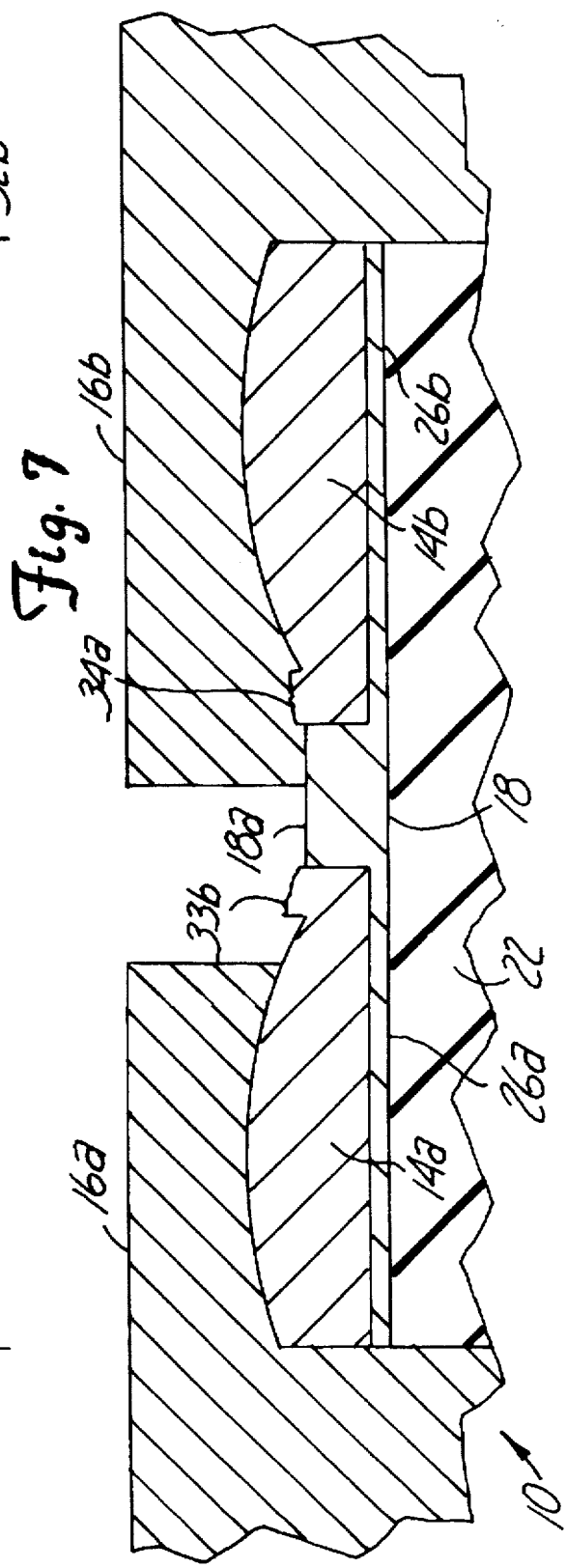

5,712,565

MR SENSOR HAVING THICK ACTIVE REGION BETWEEN TWO THINNER INACTIVE MR REGIONS TOPPED WITH RESPECTIVE PERMANENT MAGNETS

BACKGROUND OF THE INVENTION

The present invention is a magnetoresistive (MR) sensor. More specifically, the present invention is an MR sensor having an MR layer with recessed regions and permanent magnet material contained therein.

MR sensors are used to detect magnetic flux levels stored on magnetic media. In an MR sensor, the resistivity of the sensor varies with the magnitude of the flux passing through the sensor. Typically, a constant current is passed through the sensor and the magnitude of the flux passing through the sensor is represented by a change in the voltage across the sensor, which of course is a function of the resistance of the sensor. Likewise, a constant voltage source can be applied to the MR sensor, in which case the magnetic flux magnitude is represented by a change in the current through the sensor.

In an MR sensor, a linear response is achieved when the active region of the MR sensor is magnetized at approximately 45° with respect to the direction of current flow through the MR sensor. The output voltage of the MR sensor for any given input current is proportional to $COS^{2\theta}$, where $\theta$ is the angle between the static magnetization vector and the current vector. At 45°, this function, in conjunction with the saturation effects in the sensor, provides maximum equal and opposite changes in output for corresponding equal and opposite deviations in magnetic flux.

While Permalloy will naturally tend to form a magnetization vector along its long axis when it is formed into a long narrow strip, it is prone to fracturing into multiple magnetic domains when exposed to an external magnetic field. This causes Barkhausen noise. In addition, some MR sensors are not formed from long narrow strips of Permalloy. Accordingly, it is known in the art to stabilize an MR sensor to a single domain state using permanent magnets.

In the prior art, sensor stabilization is typically achieved by hard biasing or by exchange coupling. Generally, hard biasing is accomplished by positioning a boundary of a permanent magnet proximate a boundary of a magnetoresistive layer. The magnetic flux emanating from the permanent magnet boundary flows into the magnetoresistive layer, thereby stabilizing the magnetoresistive layer in a single domain state.

Exchange coupling is generally achieved by depositing an antiferromagnetic layer or a permanent magnet layer over part of the magnetoresistive layer. The magnetic characteristics of added layer are exchange coupled into the magnetoresistive layer, thereby stabilizing the magnetoresistive layer. In prior art exchange coupling configurations, it is common for the permanent magnet material to form part of the current contact structure.

SUMMARY OF THE INVENTION

The present invention is a single domain magnetoresistive sensor. The sensor is comprised of a magnetoresistive layer, at least one permanent magnet, and first and second current contacts. The magnetoresistive layer is comprised of an active sensing region having a first thickness, and at least one under layer region, with each under layer region having a second thickness that is less than the first thickness. Each permanent magnet is formed upon an under layer region of the magnetoresistive layer, and the first and second contacts are electrically coupled to the active region.

BRIEF DESCRIPTION OF THE DRAWINGS

FIGS. 2–7 are sectional views showing the method of forming the sensor of FIG. 1 from the perspective of line 2—2 in FIG. 1.

DETAILED DESCRIPTION OF THE PREFERRED EMBODIMENTS

Figure 1:
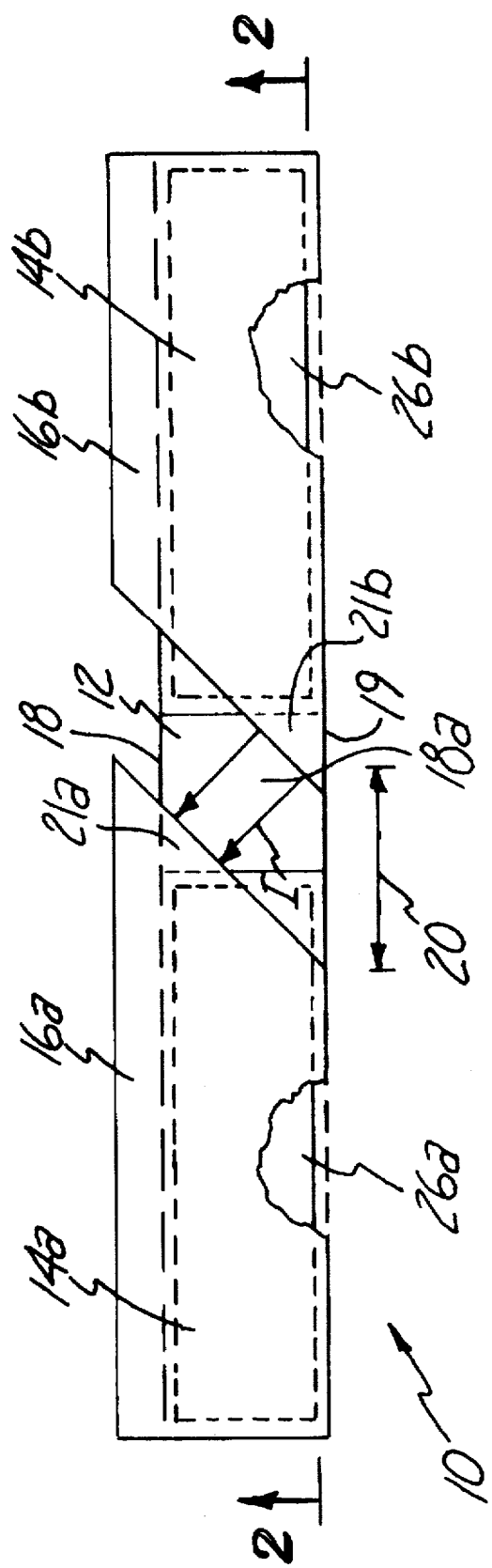
FIG. 1 shows a magnetoresistive (MR) sensor constructed in accordance with the present invention.

FIG. 1 shows a magnetoresistive (MR) sensor 10 constructed in accordance with the present invention. Sensor 10 is comprised of MR layer 12 (typically Permalloy), permanent magnets 14a and 14b, and canted contacts 16a and 16b. MR layer 12 is comprised of active region 18 and two inactive under layer regions 26a and 26b under permanent magnets 14a and 14b. Contacts 16a and 16b overlay a portion of active region 18 to form current carrying region 18a between the edges of the contacts.

In sensor 10, a read current is applied to contacts 16a and 16b. Since contacts 16a and 16b have lower resistivity than MR layer 12, current will flow out of contact 16b perpendicular to the boundary between contact 16b and current carrying region 18a. Since contact 16b is canted at approximately 45° with respect to the longitudinal axis of sensor 10, the current flows through current carrying region 18a at approximately 45° with respect to the longitudinal axis, as shown by the arrows I in region 18a.

As the current flows through current carrying region 18a, it flows from the bottom of region 18a toward the top of region 18a until it intersects contact 16a, which is also formed from a highly conductive material. The current then flows into a read amplifier.

Because the permanent magnet material has a significantly higher resistivity than the MR material, almost all the current flows from the lower right triangle 21b of contact 16b to the upper left triangle 21a of contact 16a. Virtually no current flows between the MR material and the permanent magnet material.

Sense region 20 represents the portion of sensor 10 which is used to detect magnetic flux levels stored on magnetic media. When sensor 10 is assembled in a magnetic storage device, air bearing surface 19 is positioned parallel to a magnetic media surface, with sense region 20 positioned to read tracks of the surface. For example, in a hard disc drive, sensor 10 is typically positioned at the end of an actuator arm, with air bearing surface 19 parallel to the hard disc surface, and one end of sensor 10 closer to the inner radius of the disc surface and the other end of sensor 10 closer to the outer radius of the disc surface. In this configuration, the actuator arm selectively moves sense region 20 adjacent radial tracks of the disc surface.

As the magnetic media moves with respect to MR sensor 10, the flux transitions stored on the media will pass under sense region 20. As the flux entering region 20 varies, the resistivity of current carrying region 18a of active region 18 varies. If a constant current is passed through sensor 10, then the voltage present between contacts 16a and 16b will vary as a function of the magnetic flux passing adjacent sense region 20. Likewise, if a constant voltage is applied to contact 16a and 16b, then the current flowing through sensor 10 will vary with the flux present at sense region 20.

To achieve maximum read sensitivity and minimize Barkhausen noise, it is desirable that active region 18 of MR layer 12 not fracture into multiple magnetic domains. When Permalloy is formed into a long narrow strip, the strip will naturally tend to have a magnetization vector along the long axis of the strip. However, external magnetic fields may fracture the strip into multiple magnetic domains, and the strip may not return to a single magnetic domain thereafter.

To ensure that active region 18 has a single magnetic domain having a magnetization vector directed along the longitudinal axis of sensor 10, permanent magnet 14a and 14b are positioned upon the ends of MR layer 12. Permanent magnets 14a and 14b provide a magnetic field that forces active region 18 into a single magnetic domain, making active region 18 more immune to the effects of external magnetic fields, and increasing the likelihood that active region 18 will reset into a single magnetic domain if it is fractured into multiple magnetic domains by an external magnetic field.

FIGS. 2–7 illustrate the process of forming MR sensor 10 according to the present invention. FIGS. 2–7 are oriented along line 2—2 in FIG. 1 (which is close to air bearing surface 19) to best illustrate the inventive concepts of the present invention. Although the invention is described herein with reference to a canted configuration, it is contemplated that the present invention may be used in any MR sensor configuration that requires permanent magnet stabilization. For example, abandoned U.S. patent application Ser. No. 07/936,185 filed on Aug. 25, 1992 to George et al. and entitled "Improved Read Sensitivity MR Head Using Permanent Magnet Stabilization", abandoned U.S. patent application Ser. No. 08/148,890 filed on Nov. 8, 1993 to Peter L Bonyhard and entitled "Barberpole MR Sensor Having Interleaved Permanent Magnet and Magnetoresistive Segments", and abandoned U.S. patent application Ser. No. 08/188,079 filed on Jan. 27, 1994 to Peter K. George and entitled "Read Sensitivity Function For Barberpole Bias. Design" (which are all assigned to the same assignee as the present application and are all incorporated by reference), each disclose MR sensors having permanent magnet stabilization. Accordingly, the sensors disclosed in these applications may all be constructed by the method shown in FIGS. 2–7.

To construct the sensor of FIG. 1, an MR layer 12 is applied to insulator layer 22. MR layer 12 is typically formed of Permalloy ($Ni_{80}Fe_{20}$) and is approximately 300 Å thick. Insulator layer 22 will typically be comprised of a material having desirable insulation properties, such as aluminum oxide ($Al_2O_3$).

After MR layer 12 has been applied, photoresist 24 is patterned on MR layer 12 to define the active region 18 of MR layer 12, as shown in FIG. 3. Permanent magnet material will eventually be applied to the areas not covered by photoresist 24, and the central region covered by photoresist 24 will become the active region 18 of layer 12.

In FIG. 4, the structure is subjected to ion milling or chemical etching to remove most, but not all of MR layer 12 not covered by photoresist 24, thereby leaving behind under layer regions 26a and 26b of MR layer 12. Under layer regions 26a and 26b which form inactive regions of the MR layer under permanent magnets 28 (in FIG. 5), are on the order of 50 Å to 150 Å thick.

In FIG. 5, permanent magnet layer 28 is sputter deposited over the entire structure. Layer 28 is on the order 550 Å thick over the centers of under layer regions 26a and 26b. Layer 28 is preferably comprised of cobalt platinum ($Co_{75}Pt_{25}$), but any permanent magnet material that is not magnetoresistive and has a resistivity significantly higher than the resistivity of MR layer 18 may be used. At the preferred thicknesses disclosed herein, cobalt platinum has a resistivity of approximately 80 µΩ/cm. Permalloy has a resistivity of approximately 23 µΩ/cm in the absence of an applied magnetic field.

After permanent magnet layer 28 is deposited over the structure, photoresist 24 is removed. Typically, a solvent, such as acetone, is applied to the structure. The solvent penetrates small cracks in permanent magnet layer 28 and dissolves photoresist layer 24 out from under layer 28. Once photoresist layer 24 is removed, the portions of layer 28 that are not supported from underneath are broken off, as shown in FIG. 6.

In FIG. 6, permanent magnet material remains only in the recessed areas above under layer layers 26a and 26b. As a result of the unsupported areas of photoresist layer breaking away, spikes 33a–33b and 34a–34b may remain on permanent magnets 14a and 14b, respectively. Spikes 33b and 34a are adjacent to active region 18. Ideally, one would adjust the process so that permanent magnets 14a and 14b will be at exactly the same height as active region 18. However, if the process were adjusted to achieve this goal, process variations dictate that some permanent magnet regions will be below the active MR region, while other permanent magnet regions will be above the active MR region. When a permanent magnet region is below the active MR region, the active MR region has an exposed edge that may cause the MR region to begin to fracture into multiple magnetic domains. Accordingly, spikes 33a and 34a help stabilize active region 18 into a single magnetic domain by ensuring that the edges of active region 18 are completely bounded by permanent magnet material. Preferably, the process is adjusted to minimize the height of the spikes, while ensuring that the permanent magnet material is deposited to at least same level as the MR layer. Note that in FIGS. 6 and 7, the height of the spikes is exaggerated for illustrative purposes. Using the presently preferred process disclosed herein, the spikes are about 100 Å high and about 1000 Å wide and could just as accurately be referred to as "mounds" or "hills".

Also shown in FIG. 6 is photoresist layer 30, which is applied to pattern current contacts 16a and 16b in FIG. 1. Since FIG. 6 is a sectional view shown in accordance with line 2—2 in FIG. 1, photo resist 30 is positioned toward the left side of active region 18 in FIG. 6. In addition, sensor 10 is patterned be removing material to the left of arrow 32a and to the right of arrow 32b.

In FIG. 7, current contact 16a and 16b have been applied to sensor 10 and are in electrical contact with active region 18. In addition, photoresist 30 has been removed. Since magnetoresistive layer 12 has significantly less resistivity than permanent magnets 14a and 14b, the sense current will tend to flow into active region 18, and not through permanent magnets 14a and 14b. Contacts 16a and 16b may be composed of any conducting materials having low resistivity relative to the permanent magnet material.

Although FIGS. 2–7 illustrate the method of the present invention with respect to a canted current sensor, the method can be used for any sensor having permanent magnet stabilization using any number of permanent magnets. For example, the application to Peter L Bonyhard identified above discloses a barberpole sensor having three permanent magnets, while U.S. Pat. No. 5,381,291 to Timothy A. Madsen et al. and entitled "Vertical Contact—Canted Magnet Magnetoresistive Sensor" (which is assigned to the same assignee as the present application and is incorporated by reference) illustrates a sensor having a single permanent magnet layer having a magnetization directed at 45° with respect to an air bearing surface. The method of permanent magnet stabilization of the present invention can be applied to each of the sensors disclosed in these applications.

In the prior art, permanent magnet stabilization typically comprised hard biasing or exchange coupling. Generally, hard biasing is achieved by positioning a boundary of a permanent magnet proximate a boundary of a magnetoresistive layer. The magnetic flux emanating from the magnet boundary flows into the magnetoresistive layer in an attempt to stabilize the magnetoresistive layer into a single magnetic domain.

Exchange coupling is generally achieved by forming a permanent magnet layer over part of the magnetoresistive layer. The magnetic characteristics of the permanent magnet are exchanged coupled to the magnetoresistive layer, thereby stabilizing the magnetoresistive layer.

In the U.S. application to George et al. identified above, hard biasing was achieved by applying a generally coplanar permanent magnet layer adjacent to magnetoresistive layer. The two layers were of approximately the same thickness. In this configuration, it was difficult to control the boundary between the two layers, and often gaps would be present between the two layers. These gaps resulted in the active region of the MR sensor fracturing into multiple magnetic domains. In the present invention, the same photoresist layer that defines the active region and the under layer regions of the MR layer is also used to pattern the permanent magnet material. By using the same photoresist layer, it is possible to form spies in the permanent magnet material adjacent the active region, thereby providing a superior junction between the active region and the permanent magnet material.

Without being limited to a particular theory of operation, it is believed that the permanent magnets provide a combination of exchange coupling and hard biasing. The presence of spikes 33b and 34a in FIG. 6 provide boundaries that are adjacent to active region 18. Although the permanent magnets need not be any higher than the active region of the MR layer, the spikes ensure that no gaps are present between the permanent magnets and the active region of the MR layer. The flux emanating from these boundaries is coupled into active region 18 to hard bias active region 18.

Exchange coupling occurs between permanent magnets 14a and 14b, and under layer regions 26a and 26b. In the present invention, it is believed that the Permalloy under layer region causes the permanent magnet material to grow with its hexagonal axis in-plane, thus allowing the permanent magnet to correctly bias the active region of the MR layer. Without the under layer region, the magnetization vector of the permanent magnet material will orient itself perpendicular to the plane of the substrate, and cannot produce the flux required to stabilize the active region of the MR layer.

Since Permalloy tends to naturally magnetize along its long axis when it is formed into a narrow strip, it is theorized that the crystalline structure of the Permalloy in the under layer region enhances the "in-plane" magnetic properties of the permanent magnetic material, which in turn provides hard biasing back to the active region of the active region of the MR layer. It has been found that sensors constructed in accordance with the present invention consistently have a single magnetic domain when formed from the preferred materials and dimensions disclosed above.

Although the present invention has been described with reference to preferred embodiments, workers skilled in the art will recognize that changes may be made in form and detail without departing from then spirit and scope of the invention.

What is claimed is:

1. A magnetoresistive sensor characterized by:
   a magnetoresistive layer comprising:
   an active region having a first thickness; and
   a first inactive region adjacent the active region and having a second thickness that is less than the first thickness; and
   at least a first permanent magnet on the first inactive region.

2. The magnetoresistive sensor of claim 1 wherein the first permanent magnet is formed from cobalt platinum.

3. The magnetoresistive sensor of claim 1 wherein the first permanent magnet has a higher resistivity than the active region and the magnetoresistive sensor further comprises:
   first and second current contacts electrically coupled to the active region.

4. The magnetoresistive sensor of claim 1 wherein the magnetoresistive layer further comprises:
   a second inactive region having the second thickness; and
   a second permanent magnet on the second inactive region.

5. The magnetoresistive sensor of claim 1 wherein the first permanent magnet is exchanged coupled to the first inactive region, and the first permanent magnet hard biases the active region.

6. The magnetoresistive sensor of claim 1 wherein a portion of the first permanent magnet is adjacent the active region and has a thickness such that the combined thickness of the first inactive region and the portion of the first permanent magnet is at least as great as the first thickness of the active region.

7. The magnetoresistive sensor assembly of claim 1 wherein the first inactive region is underneath the first permanent magnet.

8. A method of making a magnetoresistive sensor, comprising:
   applying a magnetoresistive layer having a first thickness to a substrate layer;
   removing a portion of the magnetoresistive layer to define an active region having the first thickness and a first inactive region having a second thickness less than the first thickness;
   applying permanent magnet material over the first inactive region of the magnetoresistive layer; and
   applying electrically conductive contact material to the permanent magnet material to define a first current contact.

9. The method of claim 8 wherein the permanent magnet material is comprised of cobalt platinum.

10. The method of claim 8 wherein the permanent magnet material has a higher resistivity than the magnetoresistive layer.

11. The method of claim 8 wherein applying permanent magnet material over the first inactive region includes forming a region of permanent magnet material adjacent the active region of the magnetoresistive layer so that the combined thickness of the first inactive region of permanent magnet material is at least as great as the first thickness.

12. The method of claim 11 wherein forming a region of permanent magnet material adjacent the active region comprises:
   applying a photoresist layer over the active and inactive regions of the magnetoresistive layer;
   forming an opening in the photoresist layer to expose at least a portion of the inactive region adjacent the active region;

depositing the permanent magnet material on the photoresist layer and the exposed portion of the inactive region; and removing the photoresist layer, thereby breaking off and removing permanent magnet material supported by the photoresist layer above the active region.

13. The method of claim 8 further including:

removing another portion, distinct from the first-named portion, of the magnetoresistive layer to define a second inactive region having a thickness less than the first thickness, the second inactive region positioned such that the active region is bounded by the first and second active regions;

applying permanent magnet material over the second inactive region; and applying electrically conductive contact material to the permanent magnet material over the second inactive region to define a second current contact.

14. A magnetoresistive sensor characterized by:

a magnetoresistive layer comprising an active region having a first thickness bounded by at least a first inactive region having a second thickness smaller than the first thickness; and at least a first permanent magnet on the first inactive region, the first permanent magnet being exchange coupled to the first inactive region and hard biasing the active region to a single domain state.

15. The magnetoresistive sensor of claim 14:

wherein the magnetoresistive layer comprises a second inactive region having the second thickness and positioned such that the active region is at least partly between the first and the second inactive regions; and wherein the sensor further comprises a second permanent magnet exchange coupled to the second inactive region and hard biasing the active region.

* * * * *

UNITED STATES PATENT AND TRADEMARK OFFICE
CERTIFICATE OF CORRECTION

PATENT NO. : 5,712,565
DATED : January 27, 1998
INVENTOR(S) : Allan E. Schultz

It is certified that error appears in the above-indentified patent and that said Letters Patent is hereby corrected as shown below:

Col. 5, line 29, delete "spies", insert --spikes--

Signed and Sealed this

Thirtieth Day of June, 1998

Attest:

BRUCE LEHMAN

Attesting Officer          Commissioner of Patents and Trademarks

Disclaimer 5,712,565—Allan E. Schultz, St. Paul; Peter K. George, Bloomington; Arthur Calderon, Minnetonka; Jumna P. Ramdular, Brooklyn Park; Juan J. Fernandez-De Castro, Lakeville; Leroy L. Longworth, Waconia, all of Minn.; Peter I. Bonyhard, Scotts Valley, Calif. MR SENSOR HAVING THICK ACTIVE REGION BETWEEN TWO THINNER INACTIVE MR REGIONS TOPPED WITH RESPECTIVE PERMANENT MAGNETS. Patent dated Jan. 27, 1998. Disclaimer filed April 2, 1998, by the assignee, Seagate Technology, Inc.

Hereby enters this disclaimer to claims 2 and 9, of said patent.
*(Official Gazette, October 20, 1998)*